US010411694B2

(12) United States Patent
Cairoli et al.

(10) Patent No.: US 10,411,694 B2
(45) Date of Patent: Sep. 10, 2019

(54) SOLID STATE SWITCH SYSTEM

(71) Applicant: ABB Schweiz AG, Baden (CH)

(72) Inventors: Pietro Cairoli, Raleigh, NC (US);
Lukas Hofstetter, Basel (CH);
Matthias Bator, Klettgau (DE);
Riccardo Bini, Baden (CH); Munaf
Rahimo, Uezwil (CH)

(73) Assignee: ABB Schweiz AG, Baden (CH)

( * ) Notice: Subject to any disclaimer, the term of this patent is extended or adjusted under 35 U.S.C. 154(b) by 264 days.

(21) Appl. No.: 15/217,571

(22) Filed: Jul. 22, 2016

(65) Prior Publication Data
US 2018/0026570 A1 Jan. 25, 2018

(51) Int. Cl.
H03K 17/567 (2006.01)
H03K 17/687 (2006.01)
H02H 7/00 (2006.01)
H03K 17/10 (2006.01)
H03K 17/12 (2006.01)
H02H 3/02 (2006.01)

(52) U.S. Cl.
CPC ............ *H03K 17/567* (2013.01); *H02H 7/005* (2013.01); *H03K 17/6872* (2013.01); H01L 2224/0603 (2013.01); H01L 2224/48091 (2013.01); H01L 2224/48137 (2013.01); H01L 2224/49113 (2013.01); H02H 3/023 (2013.01); H03K 17/102 (2013.01); H03K 17/122 (2013.01); H03K 17/125 (2013.01); H03K 2017/6875 (2013.01); H03K 2217/0036 (2013.01)

(58) Field of Classification Search
CPC ............ H02P 29/027; H03K 17/08116; H03K 17/567; H01L 2224/0603; H01L 2224/48091; H01L 2224/48137; H01L 2224/49113
See application file for complete search history.

(56) References Cited

U.S. PATENT DOCUMENTS 5,155,289 A 10/1992 Bowles
5,293,051 A 3/1994 Mariyama et al.
(Continued)

FOREIGN PATENT DOCUMENTS

EP 0272898 A2 6/1988
EP 0118007 B1 5/1990
(Continued)

OTHER PUBLICATIONS

Shen et al., "Wide-Bandgap Solid-State Circuit Breakers for DC Power Systems: Device and Circuit Considerations", vol. 62, Issue 2, 294-300, Feb. 2, 2015, IEEE Transactions on Electron Devices.
(Continued)

*Primary Examiner* — Carlos Amaya
(74) *Attorney, Agent, or Firm* — Taft Stettinius & Hollister LLP; J. Bruce Schelkopf

(57) ABSTRACT

A solid state switch has at least one FET-type device and at least one thyristor-type device coupled in parallel to the at least one FET-type device. The at least one FET-type device is constructed with a first power loss profile based on a rated current of an electrical device; and the at least one thyristor-type device is constructed with a second power loss profile based on a surge current associated with the electrical device.

24 Claims, 6 Drawing Sheets

(56) References Cited

U.S. PATENT DOCUMENTS

| | | | |
|---|---|---|---|
| 5,436,786 | A | 7/1995 | Pelly et al. |
| 6,285,170 | B1 | 9/2001 | Matsumoto et al. |
| 7,023,681 | B2 | 4/2006 | Kitahara et al. |
| 8,344,545 | B2 | 1/2013 | Fuller et al. |
| 8,422,182 | B2 | 4/2013 | Boudet et al. |
| 8,598,859 | B2 | 12/2013 | Furuichi et al. |
| 2004/0004404 | A1 | 1/2004 | Eckardt et al. |
| 2009/0033152 | A1 | 2/2009 | Harris |
| 2010/0277006 | A1 | 11/2010 | Urciuoli |
| 2010/0301929 | A1 | 12/2010 | Zhang et al. |
| 2011/0273220 | A1 | 11/2011 | Lin et al. |
| 2013/0049686 | A1 | 2/2013 | Erhart |
| 2013/0062626 | A1 | 3/2013 | Takao et al. |
| 2014/0185346 | A1 | 7/2014 | Liu et al. |

FOREIGN PATENT DOCUMENTS

| | | | |
|---|---|---|---|
| EP | 0197658 | B1 | 5/1993 |
| EP | 0674390 | A1 | 9/1995 |
| EP | 0622902 | B1 | 1/1998 |
| EP | 0910169 | A2 | 4/1999 |
| GB | 2294166 | A | 4/1996 |
| JP | 20040225138 | * | 2/2006 |

OTHER PUBLICATIONS

Urciuoli et al., "Demonstration of a 600-V, 60-A, Bidirectional Silicon Carbide Solid-state Circuit Breaker", 354-358, Applied Power Electronics Conference and Exposition (APEC), Mar. 6, 2011 Twenty-Sixth Annual IEEE. IEEE, USA.

Patent Cooperation Treaty International Search Report and Written Opinion dated Sep. 27, 2017 cited in counterpart PCT/US2017/043524 (7 pages).

* cited by examiner

SOLID STATE SWITCH SYSTEM

TECHNICAL FIELD

The present application generally relates to switches and more particularly, but not exclusively, to solid state switches.

BACKGROUND

Solid state switch systems of various types, e.g., contactors, circuit breakers, relays and other solid state switches remain an area of interest. Some existing systems have various shortcomings, drawbacks and disadvantages relative to certain applications. For example, in some solid state switches, improvements in power loss, e.g., during steady state operation of electrical devices and/or during inrush or other surge currents drawn by the electrical devices may be made. Accordingly, there remains a need for further contributions in this area of technology.

SUMMARY

One embodiment of the present invention is a solid state contactor. Another embodiment is a solid state switch. Other embodiments include apparatuses, systems, devices, hardware, methods, and combinations for solid state switch systems. Further embodiments, forms, features, aspects, benefits, and advantages of the present application shall become apparent from the description and figures provided herewith.

BRIEF DESCRIPTION OF THE FIGURES

The description herein makes reference to the accompanying drawings wherein like reference numerals refer to like parts throughout the several views, and wherein.

DETAILED DESCRIPTION OF THE ILLUSTRATIVE EMBODIMENTS

Figure 1:
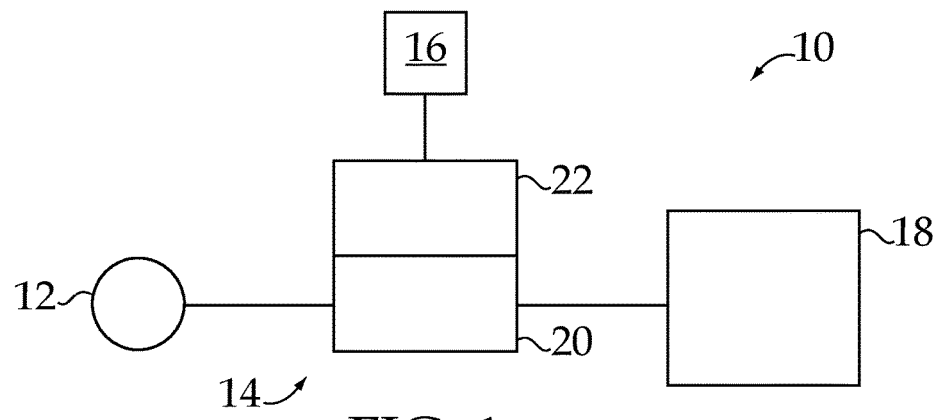
FIG. 1 schematically illustrates some aspects of a non-limiting example of an electrical system in accordance with an embodiment of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

Referring to FIG. 1, some aspects of a non-limiting example of an electrical system 10 in accordance with an embodiment of the present invention are schematically illustrated. Electrical system 10 includes a power source 12, a solid state switch system 14 coupled to power source 12, a command input 16 communicatively coupled to solid state switch system 14, and an electrical device 18 coupled to solid state switch system 14. Power source 12 is an AC power source, such as a utility grid or a facility grid or generator system, or any other AC power source. Solid state switch system 14 is a switch that is operative to connect electrical device 18 to and disconnect electrical device 18 from power source 12. Electrical device 18 may take any one or more of a variety of forms. For example, in one form, electrical device 18 is an electrical machine with a power rating of 1 kW-5 kW, such as an induction motor or any other type of electric motor. In other embodiments, electrical device 18 may be a motor rated at less than 1 kW or may be rated at greater than 5 kW In some embodiments, solid state switch system 14 may be or be a portion of a circuit breaker system, and electrical device 18 may be an electric circuit for supplying power to any number of electrically powered apparatuses that are electrically coupled thereto, for example and without limitation, one or more motors, appliances, HVAC systems, tool systems including machine tools, hand tools and other electrically powered tools, computer systems, lighting systems, conveyor systems, chemical or other processing systems, office systems, building and/or facility systems, and/or any other types of electrically powered contrivances powered by an AC voltage/current at 50 Hz, 60 Hz or any other suitable frequency. The electric circuit may be of a municipal, industrial, home or other nature. In other embodiments, solid state switch system 14 may be a relay or any other type of on/off switch. Electrical device 18 has a rated current, and has associated therewith a surge current, e.g., electrical device may draw a surge current in certain operating conditions, e.g., during startup of all or a part of electrical device 18 or during a state change of all or a part of electrical device 18.

Solid state switch system 14 includes a solid state switch 20 having solid state switching elements, and a gate driver 22. Solid state switch 20 may be disposed, for example, in a case or housing or cabinet or other protective structure (not shown). In one form, solid state switch 20 is a solid state contactor. In other embodiments, solid state switch 20 may be a relay, a circuit breaker or circuit breaker switch, or any other type of switch for industrial, home, office, workshop, municipal or any other purpose. Embodiments of solid state switch system 14 may be employed in single phase systems, two-phase systems and three-phases systems, as well as other multi-phase systems. Gate driver 22 is operative to provide gate drive signals to control the solid state switching elements of solid state switch 20 to permit or prevent the flow of current through switch 20. In some embodiments, solid state switch may include a galvanic isolator. In some embodiments, switch 14, e.g., gate driver 22 or another controller or system may include fault detection circuit and a protection circuit, e.g., a circuit breaker protection circuit operative to direct gate driver 22 to disconnect electrical device 18 from power source 12, e.g., in response to a detected short circuit condition, ground fault condition, or other safety or other fault detection. In one form, for three-phase electrical systems 10, a separate switch 20 and gate driver 22 is used for each a, b and c phase. In some three-phase embodiments, a common gate driver 22 may be constructed to provide gate drive signals to each solid state switch 20.

Command input 16 is communicatively coupled to gate driver 22. Command input 16 is operative to provide an on/off control signal to direct gate driver 22 to turn solid state switch 20 on or off, i.e., connect electrical device 18 to power source 12 or disconnect electrical device 18 from power source 12. In one form, command input 16 is a human-operated switch. In other embodiments, command input 16 may also include or alternatively be in of itself or be the output of a computer, a programmable logic circuit, a circuit breaker controller or protection control circuit, or any other electrical or electronic device operative to send an on/off signal to gate driver 22, e.g., a digital on/off signal, for turning solid state switch 20 on and off.

In considering solid state switch design, thyristor technology may be employed to make a solid state switch, e.g., a solid state contactors, and may have much higher power density than electromechanical switches. However, in many installations, any such thyristor switches or contactors might require spacing between two or more devices on the same DIN (Deutsches Institut für Normung) or other rail (e.g., up to 22 mm) in order to fully utilize thyristor current ratings. The extra spacing is necessary due to the thyristor cooling requirements, e.g., spacing required for necessary or desirable heat sinks, cooling pins/fins or other cooling structures/devices to draw heat from such thyristor devices. Any such thyristor switches used alone might be spaced more closely, but closer spacing may require the thyristor switches to be required to be derated, which in some cases means that additional switches may be required, thus adding to the space requirements for the switches and increasing cost. This is particularly true for switching motor loads beyond 4 kW and resistive loads at higher current levels, e.g., above 5-7 A. The conduction power loss of thyristor technology thus forces a move to bigger cases and different form factors from conventional electromechanical switches/contactors with the same ratings.

Figure 2:
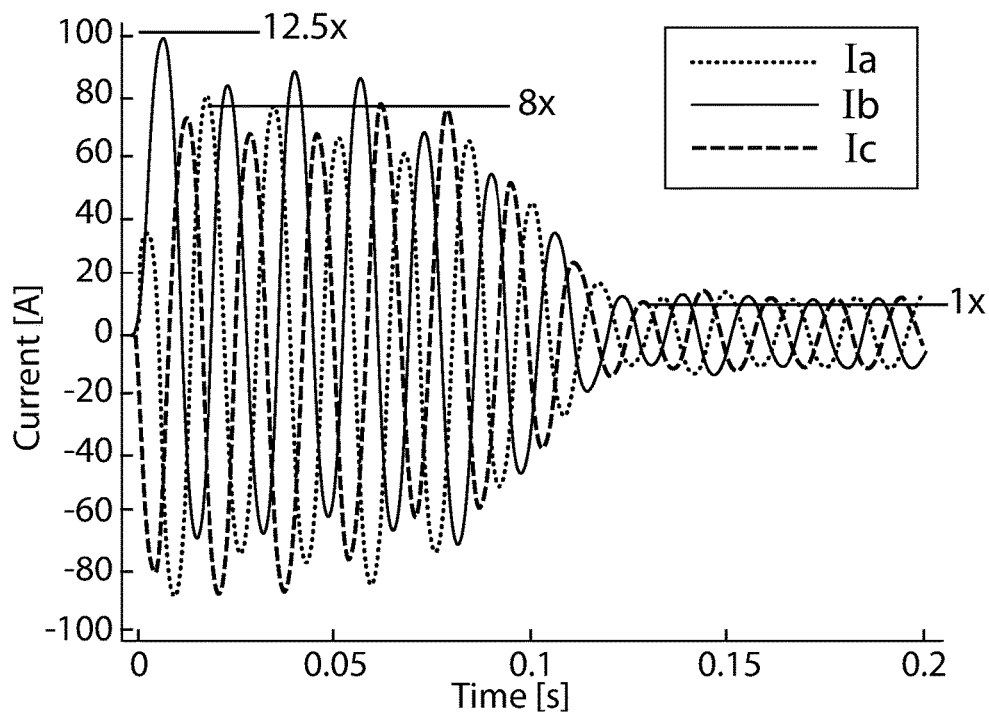
FIG. 2 illustrates some aspects of a non-limiting example of a surge current or overcurrent during startup of an electrical machine that may be employed in accordance with an embodiment of the present invention.

Considerations also include that many electrical devices such as electrical device 18 may draw surge currents in some situations, thus requiring additional heat dissipation. Surge currents include, for example and without limitation, inrush currents generally, magnetizing inrush currents, rotor lock or motor start currents, and other forms of surge currents. For example, motor loads involve conduction losses related to both currents in the nominal range and overcurrents due to inrush, e.g., magnetizing inrush, and startup of the motor. FIG. 2 illustrates a non-limiting example of a current profile of the startup of a 3-phase induction motor, where the peak inrush current reaches 12.5× the nominal current or rated current and the motor start current reaches 8× the nominal current. It should be noted that high efficiency motors are characterized with peak inrush currents up to 18-20× the nominal current. Other types of electrical devices also experience inrush currents, e.g., incandescent lighting, fluorescent lighting, compact fluorescent lighting, LED lighting, just to name a few. Some electrical devices may experience inrush currents in excess of and sometimes substantially in excess of 18-20× the nominal current. It is desirable that solid state switches, e.g., contactors, relays or other switch types, be configured to manage, and preferably optimize, power loss/heat generation profiles in view of both current flow scenarios, i.e., nominal current flow and surge current flow or overcurrents, which may in some embodiments reduce overall power loss, and/or reduce spacing requirements as between the switch elements and/or switches, e.g., on the rail.

Field Effect Transistors-type devices (FET-type devices), for example and without limitation, JFETs and MOSFETs, are power semiconductor devices with a different conduction power loss profile relative to thyristors. The voltage-current characteristic of FETs is mostly resistive and yields lower conduction losses in lower current regimes, in comparison to thyristor-type devices, which have voltage-current characteristics that are mostly comparable to a fixed voltage related to the p-n junction voltage which is typical of these types of devices. The fixed voltage characteristic generates relatively high losses compared to FET-type devices in lower current regimes, but generates relatively moderate losses as compared to FET-type devices in higher current regimes.

In accordance with embodiments of the present invention, a combination of FET-type devices and thyristor-type devices is employed in parallel as switching elements. The FET-type devices and the thyristor-type devices are each selected and constructed or sized to minimize power losses at both lower current regimes and higher current regimes, thus providing an improved loss profile. For example, in once form, switch 20 includes a terminal T1 constructed for coupling switch 20 to power source 12 for receiving power from power source 12; a terminal L1 constructed for providing power from power source 12 to electrical device 18; at least one FET-type device 24 coupled to terminal T1 and terminal L1; and at least one thyristor-type device 26 coupled to the terminal T1 and terminal L1 in parallel to the at least one FET-type device 24. In one form, the switching elements, i.e., the at least one FET-type device 24 and the at least one thyristor-type device 26 are coupled directly to respective terminals T1 and L1, i.e., without any intervening components, e.g., such as capacitors, resistors, inductors or other devices. In other embodiments, intervening components may be utilized.

The at least one FET-type device 24 is constructed with a first power loss characteristic based on the rated current; and the at least one thyristor-type device 26 is constructed with a second power loss characteristic based on a surge current, for example and without limitation, an inrush current and a start current associated with electrical device 18. Gate driver 22 is communicatively coupled to the gates of each of the at least one FET-type device 24 and the at least one thyristor-type device 26, and is operative to provide gate drive signals to the gates of each device for turning each device on or off. In some embodiments, one or more gate drivers 22 may be shared by both the at least one FET-type device 24 and the at least one thyristor-type device 26. In other embodiments, each of the at least one FET-type device 24 and the at least one thyristor-type device 26 may have one or more dedicated gate drivers 22.

Figure 4:
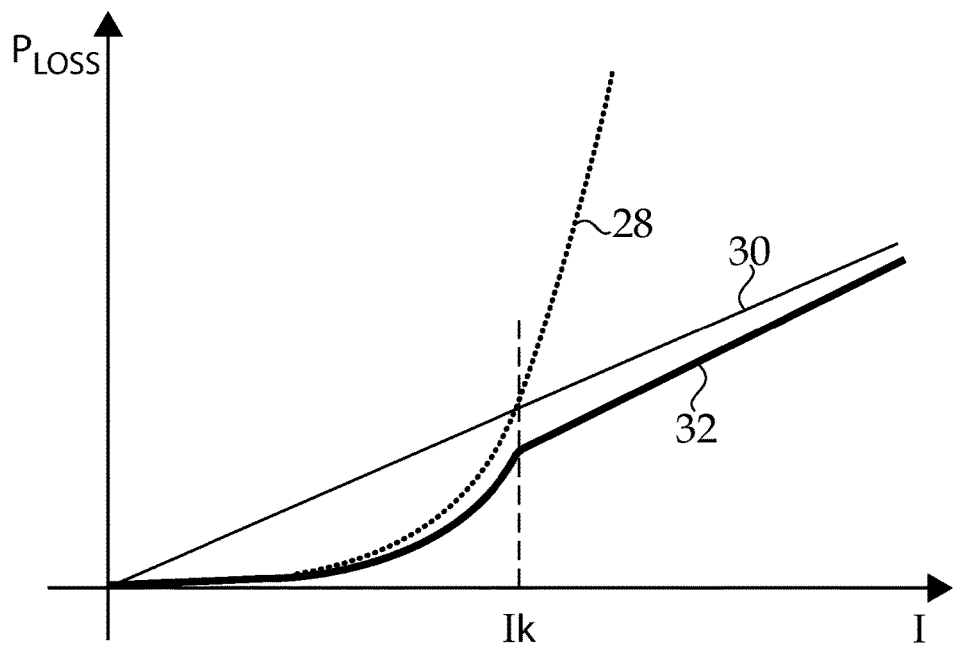
FIG. 4 illustrates some aspects of a non-limiting example of a loss profile of a FET-type device, a thyristor-type device, and a combined FET-type device and thyristor-type device in accordance with an embodiment of the present invention.

FIG. 4 illustrates some aspects of a non-limiting example of a power loss profile 28 (power loss, $P_{LOSS}$, plotted against current, I) of the at least one FET-type device 24, a power loss profile 30 of the at least one thyristor-type device 26, and a combined power loss profile 32, which reflects the power loss associated with the at least one FET-type device 24 and the at least one thyristor-type device 26 operating in parallel, and sharing the current passing through switch 20. In one form, the current sharing is natural current sharing. In other embodiments, the sharing may be forced, e.g., based on controlling the outputs of the at least one FET-type device 24 and the at least one thyristor-type device 26 using gate driver 22. In some embodiments, sharing may take place at any current level, e.g., above threshold voltage for the at least one thyristor-type device 26. In some embodiments, the current flow passing through switch 20 may not be shared at any given current level, but rather may be shared insofar as the at least one FET-type device 24 transmitting all current at lower current regimes, e.g. below some predetermined threshold value, with the at least one thyristor-type device transmitting all current in higher current regimes, e.g., above the threshold value. For example, gate driver 22 may be employed to turn off the at least one FET-type device 24 at higher currents, e.g., currents above rated current or some other threshold value, and/or may be employed to turn off the at least one thyristor-type device 26, e.g., at currents at or below rated current or some other threshold value.

The intersection of power loss profile 28 with power loss profile 30 defines a threshold current $I_k$, i.e., the current flow at which at which the power loss through the at least one FET-type device 24 equals the power loss through the at least one thyristor-type device 26. In other embodiments, another correlation between the power loss profile of the at least one FET-type device 24 and the power loss profile of the at least one thyristor-type device 26 may be used to determine threshold current $I_k$. In some embodiments, the at least one FET-type device 24 and the at least one thyristor-type device 26 are selected and constructed to have power loss profiles 28 and 30 that achieve a desired threshold current $I_k$. For example, the solid state device design parameters for each of the at least one FET-type device 24 and the at least one thyristor-type device 26 may be selected and varied to achieve a desired threshold current $I_k$. Design parameters may include, for example and without limitation, on state resistance, voltage-current characteristic, resistance of the drift region, resistance of the channel, n and p material doping parameters, n and p material layer thickness, etc. By varying or manipulating the design parameters, a construction of the at least one FET-type device 24 and the at least one thyristor-type device 26 having the desired threshold may be achieved. The at least one FET-type device 24 is constructed with a power loss profile (e.g., power loss profile 28) based on the rated current, e.g., constructed to have or achieve a power loss profile based on the rated current, wherein the power losses below rated current are less than that of the at least one thyristor-type device 26 at the same current. The at least one thyristor-type device 26 is constructed with a power loss profile (e.g., power loss profile 28) based on currents above rated current, e.g., a surge current, such as an inrush current and a start current or other surge associated with electrical device 18. For example, the at least one thyristor-type device 26 is constructed to have or achieve a power loss profile based on surge currents, wherein the power losses above rated current are less than that of the at least one FET-type device 24 at the same current.

In one form, threshold current $I_k$ is or is approximately the rated current for electrical device 18. The at least one FET-type device 24 is selected and constructed to provide current to electrical device 18 at current levels up to the threshold current $I_k$, e.g., the rated current. In various embodiments, this current flow provided by the at least one FET device 24 may be most or all of the current output by switch 20 below the rated current level. The at least one thyristor device 26 may be selected and constructed to provide a current flow to the electrical machine in excess of the threshold current. In various embodiments, this current flow provided by the at least one thyristor device 26 may be most or all of the current output by switch 20 above the rated current level, e.g., up to and including surge currents, such as any inrush currents, motor start currents or other overcurrents. The at least one FET-type device 24 is selected and constructed to have a lower power loss than the at least one thyristor-type device 26 below the rated current. The at least one thyristor-type device 26 is selected and constructed to have a lower power loss than the at least one FET-type device above the rated current, e.g., at the inrush current and start current associated with the electrical device. In other embodiments, threshold current $I_k$ is a current level greater than rated current for electrical device 18. In still other embodiments, threshold current $I_k$ may be a current level that is lower than rated current for electrical device 18.

Figure 3:
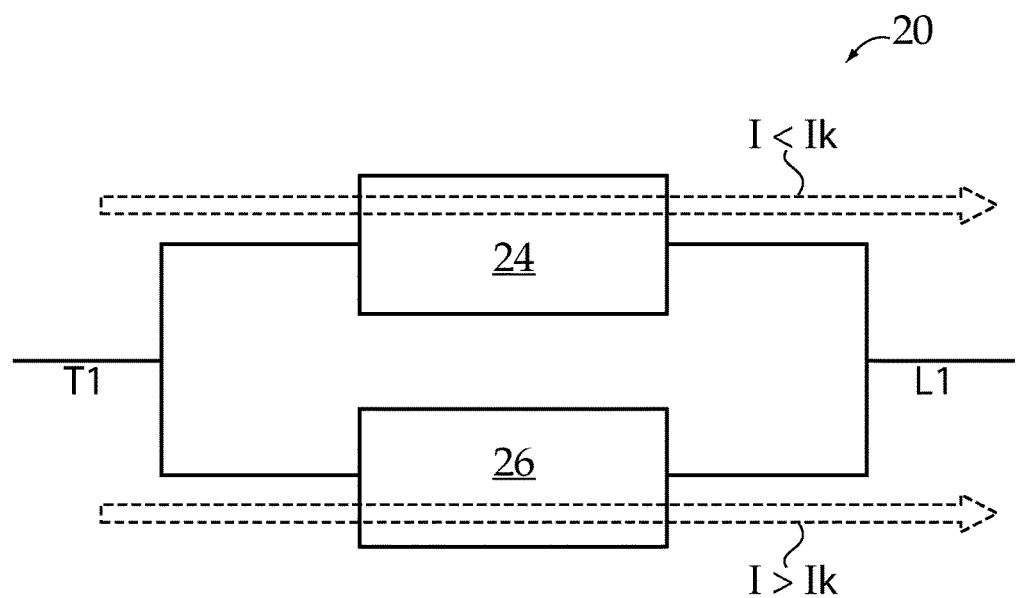
FIG. 3 schematically illustrates some aspects of a non-limiting example of a solid state switch and representative current flows during operation above and below a current threshold in accordance with an embodiment of the present invention.

At currents below threshold current $I_k$, the loss profile of the at least one FET-type device 24 dominates or primarily influences the combined loss profile 32, whereas at currents above threshold current $I_k$, the loss profile of the at least one thyristor-type device 26 dominates or primarily influences the combined loss profile 32. In some embodiments, the combined power loss profile 32 essentially or effectively overlays power loss profile 28 at current levels below threshold current $I_k$, and essentially or effectively overlays power loss profile 28 at current levels above threshold current $I_k$. In such embodiments, at current levels below threshold current $I_k$, essentially all the current passes through the at least one FET-type device 24, whereas at current levels above threshold current $I_k$, essentially all the current passes through the at least one thyristor-type device 26, as illustrated in FIG. 3.

In one form, gate driver 22 is constructed and operative to provide a continuous on signal to the gate(s) of the at least one FET-type device 24, while switch system 14 is turned on, e.g., during steady state operation. In some embodiments, gate driver 22 may be constructed and operative to provide an off signal to the gate(s) of the at least one FET-type device 24 at current levels above rated current or above threshold current $I_k$. In one form, gate driver 22 is constructed to provide a continuous off signal to the gate(s) of the at least one thyristor-type device 26 during steady state operation of electrical device 18 or operation below rated current, and to provide an on signal to the gate(s) of the at least one thyristor-type device 26 to the gate during surges above rated current, e.g., pulsed on signals or a single on signal if the thyristor-type device is forward biased, or a continuous on signal for some types of thyristor-type devices.

In some embodiments, one or more gate drivers 22 may be constructed to turn off the thyristor-type device with a delay that can be tuned to achieve retriggering and zero current turn-off. In some embodiments, one or more gate drivers 22 may be constructed to provide the at least one FET-type device with turn-on and turn-off delay that can be tuned to coordinate the current sharing between devices. Embodiments may include one or more power semiconductor control circuits for the thyristor-type devices, and one or more power semiconductor control circuits for the FET-type devices.

In various embodiments, thyristor type device 26 may be, for example and without limitation, one or more thyristors and/or SCRs and/or TRIACs. In some embodiments, one or more thyristors may be substituted with bipolar devices. Thyristor-type device 26 may also be or include one or more integrated gate-commutated thyristors (IGCTs), insulated-Gate Bipolar Transistors (IGBTs), gate turn-off thyristors (GTOs), and MOS-controlled thyristors (MCTs).

The at least one FET-type device 24 may be, for example and without limitation, two three quadrant FETs in back-to-back or anti serial configuration, or one four quadrant FET. The three quadrant FET-type device may be, for example and without limitation, a SiC Junction gate field-effect transistor (JFET), SiC JFET in Cascode configuration with Si MOSFET or GaN MOSFET, a SiC Metal Oxide Semiconductor Field-Effect Transistor (MOSFET), SiC Junction gate field-effect transistor with an anti parallel diode, a SiC Metal Oxide Semiconductor Field-Effect Transistor with an anti parallel diode, or other types of three quadrant FET devices. The four quadrant FET-type device may be, for example and without limitation, a GaN four quadrant FET, a symmetrical normally-ON SiC JFET, or a dual-gate normally-ON GaN HEMT, or other types of four quadrant FET devices. FET-type device 24 may also be or include one or more of a GaN High-Electron-Mobility Transistor (HEMT), GaN field-effect transistor (FET), a GaN Enhancement mode HEMT (E-HEMT), a Si Metal Oxide Semiconductor Field-Effect Transistor (MOSFET), a Si Junction gate field-effect transistor (JFET), a Si Super Junction MOSFET and Wide-Band Gap, SiC, GaN, Diamond semiconductor devices. Diodes, e.g., employed in the Cascode configuration, may include, for example and without limitation, one or more of a Pn diode, Schottky diode, an SiC Schottky diode, or one or more other diode types. Although illustrated with respect to a Cascode configuration, it will be understood that in some embodiments, diodes may be used in conjunction with other FET-type devices as well, e.g., as freewheeling diodes.

Figure 5:
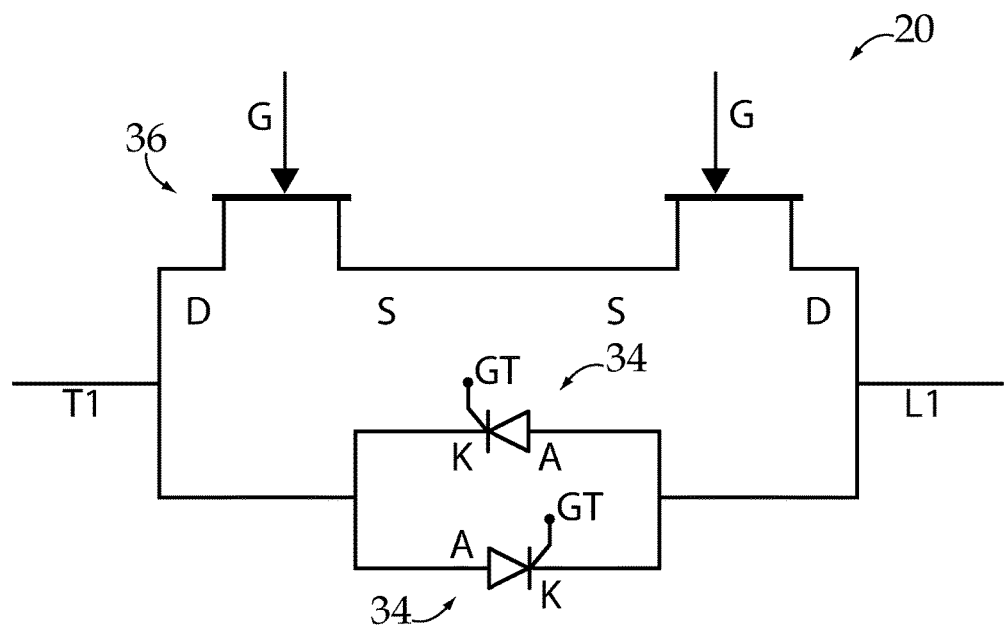
FIG. 5 schematically illustrates some aspects of a non-limiting example of a solid state switch in accordance with an embodiment of the present invention.
Figure 6:
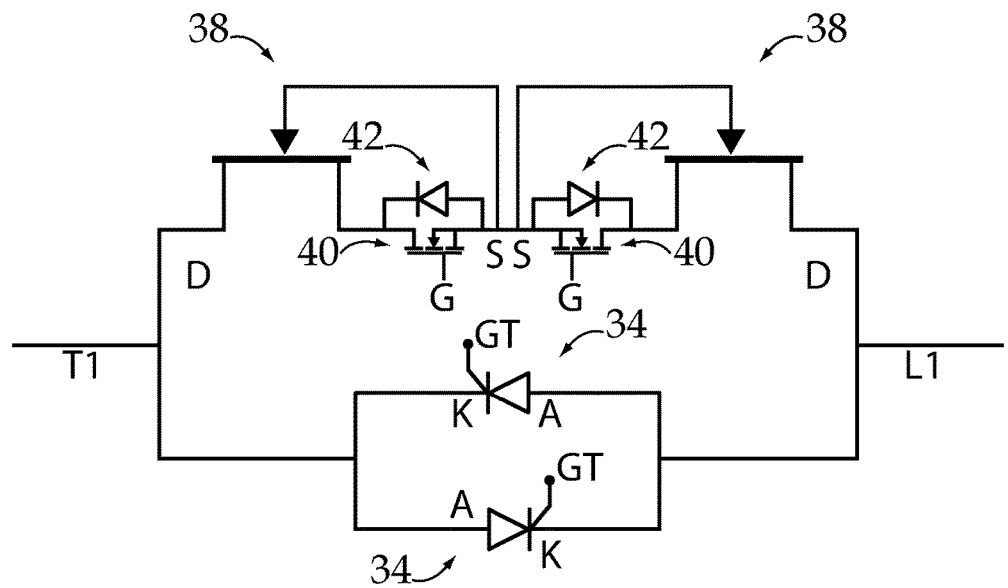
FIG. 6 schematically illustrates some aspects of a non-limiting example of a solid state switch in accordance with an embodiment of the present invention.
Figure 7:
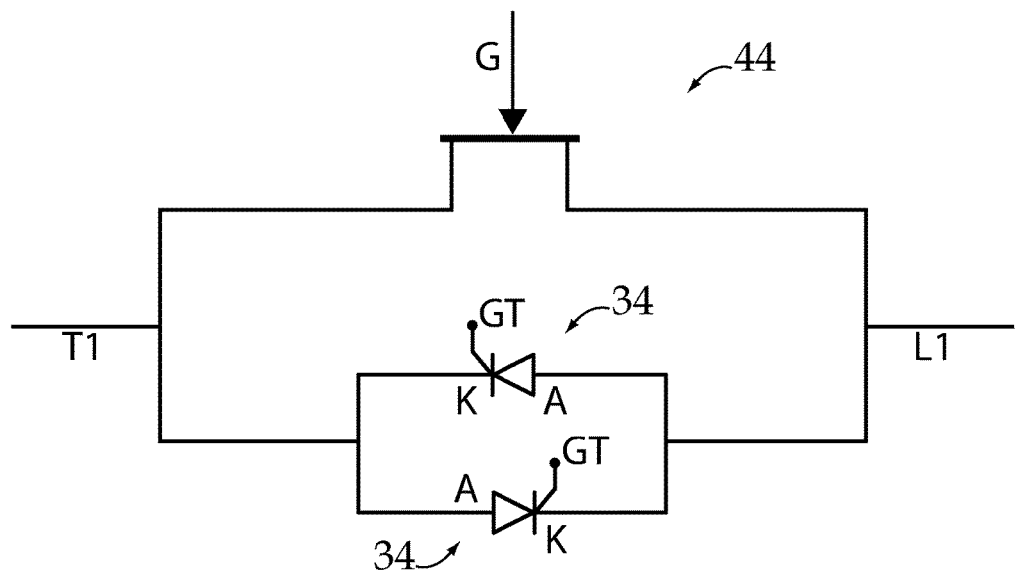
FIG. 7 schematically illustrates some aspects of a non-limiting example of a solid state switch in accordance with an embodiment of the present invention.
Figure 8:
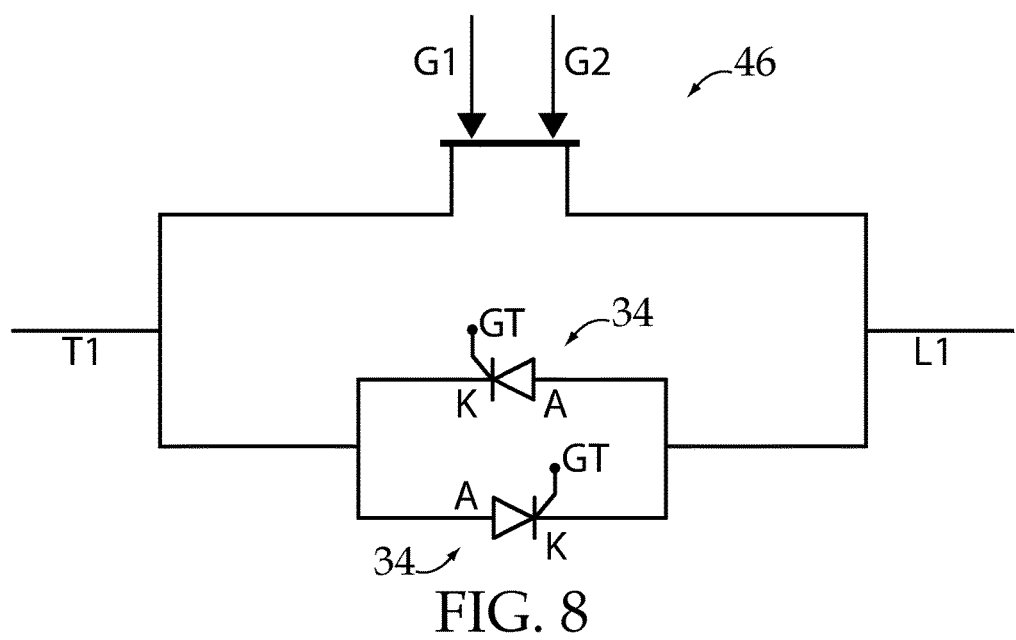
FIG. 8 schematically illustrates some aspects of a non-limiting example of a solid state switch in accordance with an embodiment of the present invention.

Referring to FIGS. 5-8, the at least thyristor-type device 26 may be a single thyristor-type device in some embodiments, and in other embodiments may be or include a first thyristor-type device 34 coupled to terminal T1 and to terminal L1 in parallel with the at least one FET-type device 24; and a second thyristor-type device 34 coupled to terminal T1 and to terminal L1 anti parallel to the first thyristor-type device 34. Each thyristor-type device 34, e.g., each thyristor, has an anode A, a cathode K and gate GT. The embodiment of FIG. 5 illustrates wherein the at least one FET-type device 24 is two three quadrant FETs 36 coupled in anti series, each FET 36 having a gate G, a source S and a drain D. The embodiment of FIG. 6 illustrates wherein the at least one FET-type device is two Cascode JFETs 38 with corresponding low voltage MOSFETs 40 and freewheeling diodes 42, each Cascode JFET having a having a gate G, a source S and a drain D. The embodiment of FIG. 7 illustrates wherein the at least one FET-type device is a four quadrant FET 44 having a gate G. The embodiment of FIG. 8 illustrates wherein the at least one FET-type device is a four quadrant dual-gate FET 46 having two gates G1 and G2.

Figure 9:
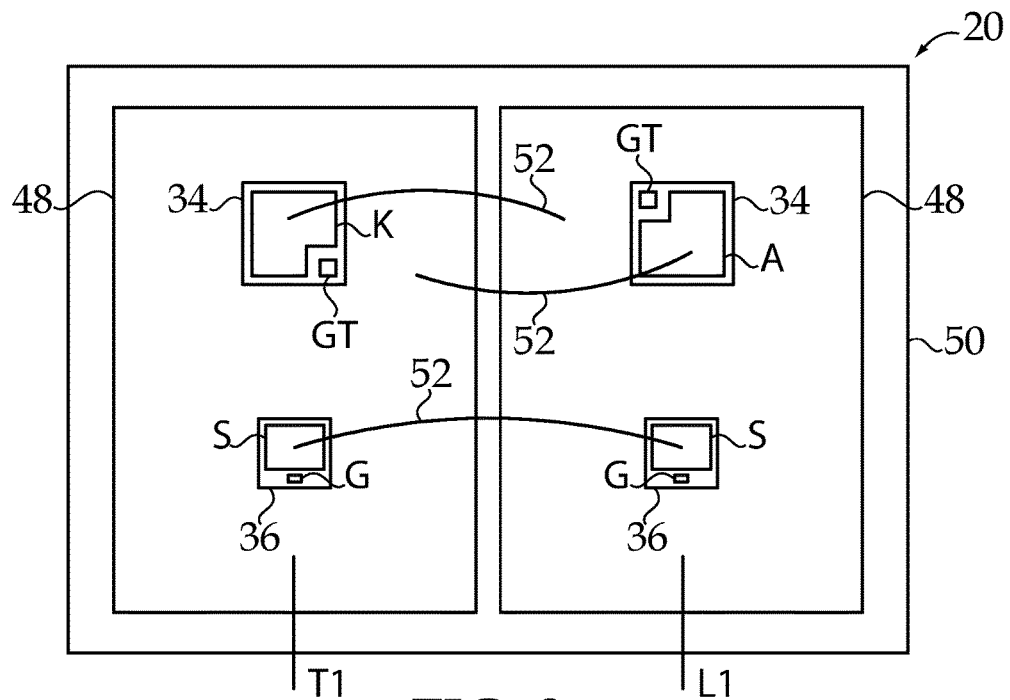
FIG. 9 schematically illustrates some aspects of a non-limiting example of a topology of example of a solid state switch in accordance with an embodiment of the present invention.
Figure 10:
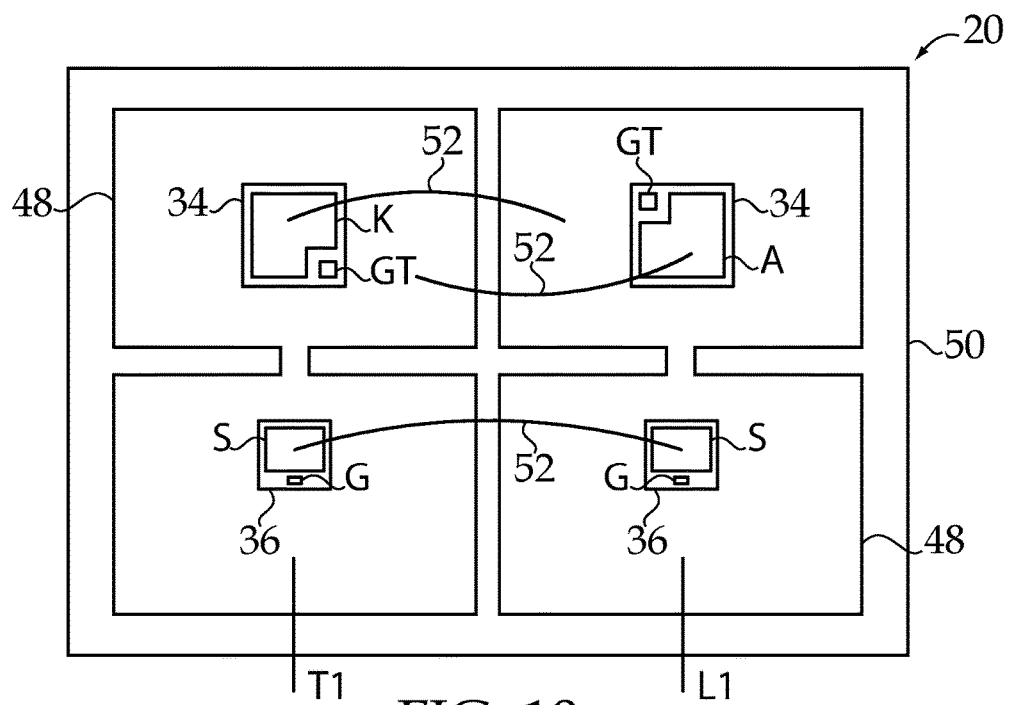
FIG. 10 schematically illustrates some aspects of a non-limiting example of a topology of example of a solid state switch in accordance with an embodiment of the present invention.
Figure 11:
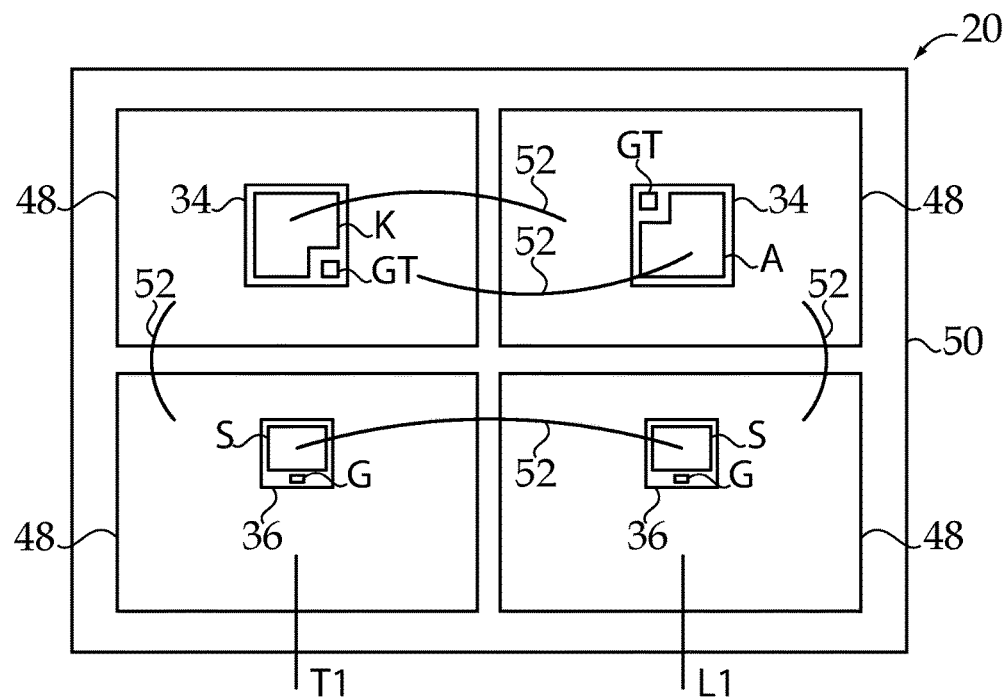
FIG. 11 schematically illustrates some aspects of a non-limiting example of a topology of example of a solid state switch in accordance with an embodiment of the present invention.
Figure 12:
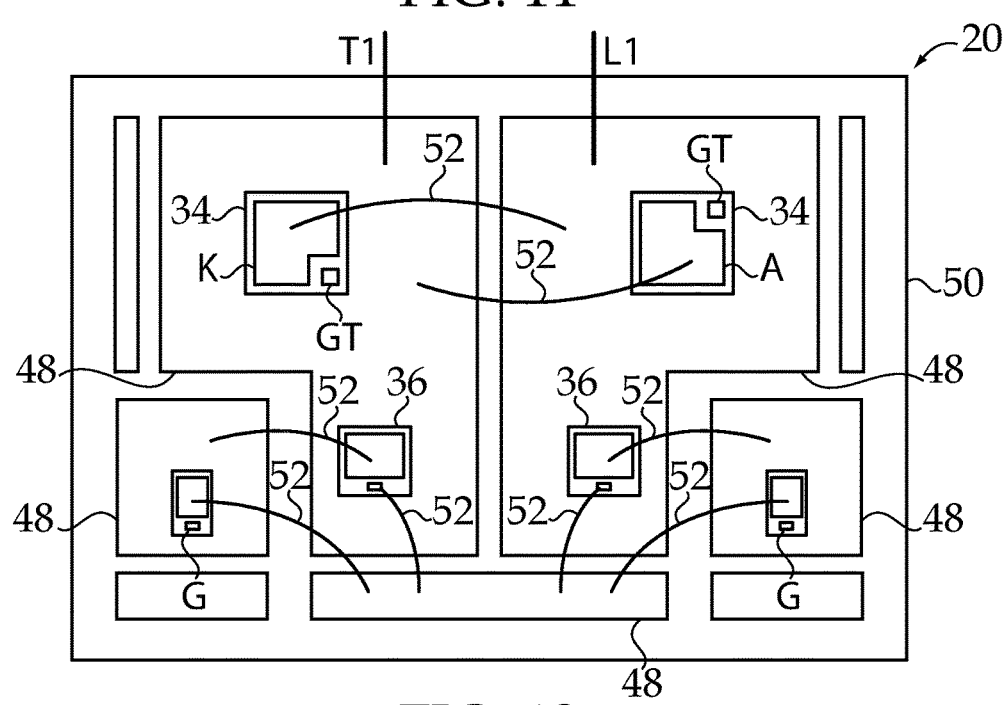
FIG. 12 schematically illustrates some aspects of a non-limiting example of a topology of example of a solid state switch in accordance with an embodiment of the present invention.

Solid state switch 20 may be realized in various manners, for example and without limitation, with prepackaged discrete components, e.g., discrete FET-type devices and discrete thyristor-type devices, and discrete dies, e.g., FET-type device dies and FET-type device dies. FIG. 9 illustrates an embodiment of the solid state switch of FIG. 5 in a custom package. A direct bond copper substrate has adjacent copper layers 48, e.g., one copper layer 48 for each FET 38/thyristor 34 pair, disposed over a substrate 50. Electrical coupling between switching elements is obtained by copper layers 48 and wires 52. FIG. 10 illustrates an embodiment similar to that of FIG. 9, except that the embodiment of FIG. 10 includes thermal decoupling of each FET 38/thyristor 34 pair. FIG. 11 illustrates an embodiment similar to that of FIGS. 9 and 10, except that the embodiment of FIG. 11 includes thermal separation of each FET 38/thyristor 34 pair. FIG. 12 illustrates an embodiment of the solid state switch of FIG. 6, which is two thyristors and two Cascode JFETs (SiC JFET+Si MOSFET) in a custom package.

Embodiments of the present invention include a solid state contactor system for connecting and disconnecting an electrical machine to/from a power source, the electrical machine having a rated current, comprising: a first terminal constructed for coupling to and receiving power from a power source; a second terminal constructed for providing power from the power source to the electrical machine; at least one FET-type device coupled to the first terminal and the second terminal; and at least one thyristor-type device coupled to the first terminal and the second terminal in parallel to the at least one FET-type device, wherein the at least one FET-type device is constructed with a first power loss profile based on the rated current; and wherein the at least one thyristor-type device is constructed with a second power loss profile based on an inrush current and a start current associated with the electrical machine.

In a refinement, the at least one FET-type device is selected and constructed to have a lower power loss than the at least one thyristor-type device at and below the rated current; and the at least one thyristor-type device is selected and constructed to have a lower power loss than the at least one FET-type device at the inrush current and start current associated with the electrical machine.

In another refinement, current flow is shared between the at least one FET-type device and the at least one thyristor-type device.

In yet another refinement, the at least one thyristor-type device includes: a first thyristor-type device coupled directly to the first terminal and the second terminal in parallel with the at least one FET-type device; and a second thyristor-type device coupled directly to the first terminal and the second terminal in anti parallel with the first thyristor-type device.

In still another refinement, the at least one FET-type device includes a gate, further comprising a gate driver in communication with the gate and operative to provide a continuous on signal to the gate during operation of the electrical machine.

In yet still another refinement, the at least one thyristor-type device includes a gate, further comprising a gate driver in communication with the gate and operative to provide a continuous off signal to the gate during steady state operation of the electrical machine, In a further refinement, the gate driver is operative to provide pulsed and/or continuous on signals to the at least one thyristor-type device at currents above the rated current.

In another further refinement, the at least one FET-type device is at least two FET-type devices coupled in anti series.

In a yet further refinement, the rated current is at or below a threshold current; the at least one FET-type device is selected and constructed to provide a first current flow to the electrical machine below the threshold current; and the at least one thyristor-type device is selected and constructed to provide a second current flow to the electrical machine in excess of the threshold current.

In a still further refinement, the threshold current is defined as a current flow at which the power loss through the at least one FET-type device equals the power loss through the at least one thyristor-type device; and the at least one FET-type device and the at least one thyristor-type device are selected and constructed to have power loss profiles that achieve a desired threshold current at or above the rated current.

In a yet still further refinement, wherein the at least one FET-type device is selected and constructed to provide current to the electrical machine at current levels up to the rated current; and wherein the at least one thyristor device is selected and constructed to provide a current flow to the electrical machine in excess of the rated current.

Embodiments of the present invention include a solid state switch system constructed to connect and disconnect an electrical device to/from a power source, comprising: a first terminal constructed for coupling to a power source; a second terminal constructed for providing power received from the power source to the electrical device; at least one FET-type device coupled to the first terminal and the second terminal; and at least one thyristor-type device coupled to the first terminal and the second terminal in parallel to the at least one FET-type device, wherein the at least one FET-type device is selected and constructed to provide a first current flow to the electrical device up to a threshold current; and wherein the at least one thyristor-type device is selected and constructed to provide a second current flow to the electrical device in excess of the threshold current; and wherein the at least one FET-type device is constructed with a first power loss profile; wherein the at least one thyristor-type device is constructed with a second power loss profile, and wherein the threshold current is based on a correlation between the first power loss profile and the second power loss profile.

In a refinement, wherein the threshold current is a current flow at which the power loss through the at least one FET-type device is approximately equal to or less than the power loss through the at least one thyristor-type device.

In another refinement, the electrical device has a rated current; and the at least one FET-type device and the at least one thyristor-type device are selected and constructed to have respective first and second power loss profiles that yield a desired threshold current approximately at the rated current or above the rated current.

In yet another refinement, the at least one thyristor-type device includes: a first thyristor-type device coupled directly to the first terminal and to the second terminal in parallel to the at least one FET-type device; and a second thyristor-type device coupled directly to the first terminal and to the second terminal in anti parallel to the first thyristor-type device.

In still another refinement, the at least one FET-type device is at least two FET-type devices coupled in anti series.

In yet still another refinement, the at least one FET-type device and the at least one thyristor-type device are selected and constructed to share a current flowing from the power source to the electrical device.

In a further refinement, the at least one FET-type device includes a gate, further comprising a gate driver in communication with the gate and operative to provide a continuous on signal to the gate during operation of the electrical machine.

In a yet further refinement, the electrical device has a rated current; and wherein the at least one thyristor-type device includes a gate, further comprising a gate driver in communication with the gate and operative to provide a continuous off signal to the gate during steady state operation of the electrical device, and to provide an on signal to the gate during surges above rated current.

Embodiments of the present invention include a solid state switch system constructed to connect and disconnect an electrical device to/from a power source, the electrical device having a rated current, comprising: a first terminal constructed for coupling to a power source; a second terminal constructed for providing power received from the power source to the electrical device; first means for controlling current flow; and second means for controlling current flow disposed in parallel to the first means for controlling current flow, wherein the first means for controlling current flow is constructed with a first power loss profile based on the rated current; and wherein the second means for controlling current flow is constructed with a second power loss profile based on a surge current associated with the electrical device.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. A solid state contactor system for connecting and disconnecting an electrical machine to/from a power source, the electrical machine having a rated current, comprising:

a first terminal constructed for coupling to and receiving power from a power source;

a second terminal constructed for providing power from the power source to the electrical machine;

at least one FET-type device coupled to the first terminal and the second terminal; and at least one thyristor-type device coupled to the first terminal and the second terminal in parallel to the at least one FET-type device, wherein the at least one FET-type device is constructed with a first power loss profile based on the rated current;

wherein the at least one thyristor-type device is constructed with a second power loss profile based on an inrush current and a start current associated with the electrical machine;

wherein the at least one FET-type device is selected and constructed to have a lower power loss than the at least one thyristor-type device at and below the rated current; and wherein the at least one thyristor-type device is selected and constructed to have a lower power loss than the at least one FET-type device at the inrush current and start current associated with the electrical machine.

2. The solid state contactor system of claim 1, wherein current flow is shared between the at least one FET-type device and the at least one thyristor-type device.

3. The solid state contactor system of claim 1, wherein the at least one thyristor-type device includes:
 a first thyristor-type device coupled directly to the first terminal and the second terminal in parallel with the at least one FET-type device; and
 a second thyristor-type device coupled directly to the first terminal and the second terminal in anti parallel with the first thyristor-type device.

4. The solid state contactor system of claim 1, wherein the at least one FET-type device includes a gate, further comprising a gate driver in communication with the gate and operative to provide a continuous on signal to the gate during operation of the electrical machine.

5. The solid state contactor system of claim 1, wherein the at least one thyristor-type device includes a gate, further comprising a gate driver in communication with the gate and operative to provide a continuous off signal to the gate during steady state operation of the electrical machine.

6. The solid state contactor system of claim 5, wherein the gate driver is operative to provide pulsed and/or continuous on signals to the at least one thyristor-type device at currents above the rated current.

7. The solid state contactor system of claim 1, wherein the at least one FET-type device is at least two FET-type devices coupled in anti series.

8. The solid state contactor system of claim 1, wherein the rated current is at or below a threshold current; wherein the at least one FET-type device is selected and constructed to provide a first current flow to the electrical machine below the threshold current; and wherein the at least one thyristor-type device is selected and constructed to provide a second current flow to the electrical machine in excess of the threshold current.

9. The solid state contactor system of claim 8, wherein the threshold current is defined as a current flow at which the power loss through the at least one FET-type device equals the power loss through the at least one thyristor-type device; and wherein the at least one FET-type device and the at least one thyristor-type device are selected and constructed to have power loss profiles that achieve a threshold current at or above the rated current.

10. The solid state contactor system of claim 1, wherein the at least one FET-type device is selected and constructed to provide current to the electrical machine at current levels up to the rated current; and wherein the at least one thyristor device is selected and constructed to provide a current flow to the electrical machine in excess of the rated current.

11. A solid state switch system constructed to connect and disconnect an electrical device to/from a power source, comprising:
 a first terminal constructed for coupling to a power source;
 a second terminal constructed for providing power received from the power source to the electrical device;
 at least one FET-type device coupled to the first terminal and the second terminal; and
 at least one thyristor-type device coupled to the first terminal and the second terminal in parallel to the at least one FET-type device,
 wherein the at least one FET-type device is selected and constructed to provide a first current flow to the electrical device up to a threshold current; and wherein the at least one thyristor-type device is selected and constructed to provide a second current flow to the electrical device in excess of the threshold current;
 wherein the at least one FET-type device is constructed with a first power loss profile; wherein the at least one thyristor-type device is constructed with a second power loss profile, and wherein the threshold current is based on a correlation between the first power loss profile and the second power loss profile; and
 wherein the threshold current is a current flow at which the power loss through the at least one FET-type device is approximately equal to the power loss through the at least one thyristor-type device.

12. The solid state switch system of claim 11, wherein the electrical device has a rated current; and wherein the at least one FET-type device and the at least one thyristor-type device are selected and constructed to have respective first and second power loss profiles that yield the threshold current approximately at the rated current or above the rated current.

13. The solid state switch system of claim 11, wherein the at least one thyristor-type device includes:
 a first thyristor-type device coupled directly to the first terminal and to the second terminal in parallel to the at least one FET-type device; and
 a second thyristor-type device coupled directly to the first terminal and to the second terminal in anti parallel to the first thyristor-type device.

14. The solid state switch system of claim 11, wherein the at least one FET-type device is at least two FET-type devices coupled in anti series.

15. The solid state switch system of claim 11, wherein the at least one FET-type device and the at least one thyristor-type device are selected and constructed to share a current flowing from the power source to the electrical device.

16. The solid state switch system of claim 11, wherein the at least one FET-type device includes a gate, further comprising a gate driver in communication with the gate and operative to provide a continuous on signal to the gate during operation of the electrical machine.

17. The solid state switch system of claim 16, wherein the electrical device has a rated current; and wherein the at least one thyristor-type device includes a gate, further comprising a gate driver in communication with the gate and operative to provide a continuous off signal to the gate during steady state operation of the electrical device, and to provide an on signal to the gate during surges above rated current.

18. A solid state switch system constructed to connect and disconnect an electrical device to/from a power source, the electrical device having a rated current, comprising:
  a first terminal constructed for coupling to a power source;
  a second terminal constructed for providing power received from the power source to the electrical device;
  first means for controlling current flow; and
  second means for controlling current flow disposed in parallel to the first means for controlling current flow,
  wherein the first means for controlling current flow is constructed with a first power loss profile based on the rated current; and
  wherein the second means for controlling current flow is constructed with a second power loss profile based on a surge current associated with the electrical device,
  wherein at least one FET-type device is selected and constructed to have a lower power loss than at least one thyristor-type device at and below the rated current; and
  wherein the at least one thyristor-type device is selected and constructed to have a lower power loss than the at least one FET-type device at the surge current associated with the electrical machine.

19. The solid state contactor system of claim 2, wherein current flow is shared in the form of natural current sharing.

20. The solid state contactor system of claim 2, wherein current flow is shared in the form of forced current sharing.

21. The solid state contactor system of claim 1, wherein the at least one FET-type device is two three-quadrant FETs.

22. The solid stator contractor system of claim 1, wherein the at least one FET-type device is two Cascode JFETs, each Cascode JFET including a corresponding low voltage MOSFET and a freewheeling diode.

23. The solid stator contractor system of claim 1, wherein the at least one FET-type device is a single four quadrant FET.

24. The solid stator contractor system of claim 1, wherein the at least one FET-type device is a single four quadrant dual-gate FET.

* * * * *